US005744390A

United States Patent [19]

Chao

[11] Patent Number: 5,744,390
[45] Date of Patent: Apr. 28, 1998

[54] METHOD OF FABRICATING A DRAM CELL WITH A PLURALITY OF VERTICAL EXTENSIONS

[75] Inventor: Fang-Ching Chao, Hsinchu, Taiwan

[73] Assignee: United Microelectronics Corporation, Taiwan

[21] Appl. No.: 736,926

[22] Filed: Oct. 25, 1996

[30] Foreign Application Priority Data

Aug. 16, 1996 [TW] Taiwan .................................. 85109999

[51] Int. Cl.⁶ ........................................... H01L 21/8242
[52] U.S. Cl. ............................................ 438/254; 438/657
[58] Field of Search ...................................... 438/253, 254, 438/255, 396, 397, 398, 592, 657, 666

[56] References Cited

U.S. PATENT DOCUMENTS

| 5,071,783 | 12/1991 | Taguchi et al. . |
| 5,077,688 | 12/1991 | Kumanoya et al. . |
| 5,089,869 | 2/1992 | Matsuo et al. . |
| 5,102,820 | 4/1992 | Chiba . |
| 5,126,810 | 6/1992 | Gotou . |
| 5,142,639 | 8/1992 | Kohyama et al. . |
| 5,155,657 | 10/1992 | Oehrlein et al. . |
| 5,158,905 | 10/1992 | Ahn . |
| 5,164,337 | 11/1992 | Ogawa et al. . |
| 5,172,201 | 12/1992 | Suizu . |
| 5,196,365 | 3/1993 | Gotou . |
| 5,206,787 | 4/1993 | Fujioka . |
| 5,266,512 | 11/1993 | Kirsch . |
| 5,274,258 | 12/1993 | Ahn . |
| 5,338,955 | 8/1994 | Tamura et al. . |
| 5,354,704 | 10/1994 | Yang et al. . |
| 5,371,701 | 12/1994 | Lee et al. . |

(List continued on next page.)

FOREIGN PATENT DOCUMENTS

| 0516031A1 | 12/1992 | European Pat. Off. . |
| 4-26156 | 1/1992 | Japan . |
| 5-12745 | 1/1993 | Japan . |
| 5-251657 | 9/1993 | Japan . |
| 2 252 447 | 8/1992 | United Kingdom . |

OTHER PUBLICATIONS

"Mini-Trenches in Polysilicon For Dram Storage Capacitance Enhancement", IBM Technical Disclosure Bulletin, vol. 33, No. 9, Feb. 1991.

Ema et al., "3-Dimensional Stacked Capacitor Cell for 16M and 64M DRAMS", International Electron Devices Meeting, pp. 592-595, Dec. 1988.

Wakamiya et al., "Novel Stacked Capacitor Cell for 64-Mb DRAM", 1989 Symposium on VLSI Technology Digest of Technical papers, pp. 69-70.

Primary Examiner—Chandra Chaudhari
Attorney, Agent, or Firm—Rabin, Champagne & Lynt, P.C.

[57] ABSTRACT

Fabricating a DRAM memory cell with increased capacitance by increasing the surface area of a storage electrode of a storage capacitor includes forming transfer transistor having a gate electrode and source-drain electrode areas on a semiconductor substrate. First, second and third insulating layers are formed in sequence on the semiconductor substrate and the transfer transistor. The third, second and first insulating layers are selectively etched through to form a contact opening exposing one of the source-drain electrode areas as a contact area. An upper portion of the third insulating layer is etched to form a plurality of first trenches. A first conductive layer is formed over the insulating layer filling the contact opening and the first trenches. An upper portion of the first conductive layer is etched to form a plurality of second trenches, and selectively etched to define a pattern area of a storage electrode of a capacitor. The storage electrode includes a vertical frame which contacts the contact area through the contact opening, and a horizontal plate having a plurality of extending areas which extend out vertically therefrom. Using the second insulating layer as an etching stop, the third insulating layer is removed by isotropic etching. A dielectric layer is formed on exposed surfaces of the storage electrode. A second conductive layer, which acts as an opposed electrode of the capacitor, is formed on the dielectric layer.

20 Claims, 18 Drawing Sheets

U.S. PATENT DOCUMENTS

| | | |
|---|---|---|
| 5,389,568 | 2/1995 | Yun . |
| 5,399,518 | 3/1995 | Sim et al. . |
| 5,438,011 | 8/1995 | Blalock et al. . |
| 5,443,993 | 8/1995 | Park et al. . |
| 5,453,633 | 9/1995 | Yun . |
| 5,460,996 | 10/1995 | Ryou . |
| 5,468,670 | 11/1995 | Ryou ........................................ 438/253 |
| 5,478,768 | 12/1995 | Iwasa . |
| 5,478,770 | 12/1995 | Kim . |
| 5,482,886 | 1/1996 | Park et al. . |
| 5,508,222 | 4/1996 | Sakao . |
| 5,521,419 | 5/1996 | Wakamiya et al. . |
| 5,523,542 | 6/1996 | Chen et al. . |
| 5,543,346 | 8/1996 | Keum et al. . |
| 5,550,080 | 8/1996 | Kim . |
| 5,561,309 | 10/1996 | Cho et al. . |
| 5,561,310 | 10/1996 | Woo et al. . |
| 5,571,742 | 11/1996 | Jeong ........................................ 438/254 |
| 5,572,053 | 11/1996 | Ema . |
| 5,595,931 | 1/1997 | Kim . |

5,744,390

1

METHOD OF FABRICATING A DRAM CELL WITH A PLURALITY OF VERTICAL EXTENSIONS

BACKGROUND OF THE INVENTION

1. Field of the Invention

This invention relates in general to a method of fabricating semiconductor memory devices, and more particularly to a method of forming a capacitor with a storage electrode constructed with a vertical frame and a horizontal plate, wherein the horizontal plate has a plurality of extensions extending out vertically.

2. Description of Related Art

A DRAM (dynamic random access memory) is a widely used integrated circuit device, and plays an indispensable role in the electronic industry. FIG. 1 is a circuit diagram illustrating a conventional DRAM memory cell. As shown in FIG. 1, a memory cell includes a transfer transistor T and a storage capacitor C. The source electrode of the transfer transistor T is coupled to a corresponding bit line BL, the drain electrode of the transfer transistor T is coupled to a storage electrode 6 of the storage capacitor C, and the gate electrode of the transfer transistor T is coupled to a corresponding word line WL. An opposed electrode 8 of the storage capacitor C is coupled to a stationary voltage source VCP. A dielectric layer 7 is deposited between the storage electrode 6 and the opposed electrode 8. As known by those skilled in this art, the storage capacitor C is used for storing data, and should have enough capacitance to avoid a loss of data.

In a conventional fabricating process for a DRAM device having a storage capacity below 1 MB, a two dimensional capacitance device, e.g., a planar-type capacitor, is widely used for storing data. As shown in FIG. 2, a field oxide layer 11 is formed on a substrate 10 to define an active region, then gate oxide layer 12, gate electrode layer 13, and source and drain electrode areas 14 are formed in sequence to form a transfer transistor T. On the surface of the substrate 10, a dielectric layer 7 and a conductive layer 8 are formed on one side adjacent to the drain. The area where the dielectric layer 7 and the conductive layer 8 join with the substrate 10 forms a storage capacitor C. However, the planar-type capacitor occupies a relatively large surface area of the device to form the storage capacitor C, which is at odds with the desire for large scale integration of the DRAM device.

A highly integrated DRAM, e.g., with a storage capacity of 4 MB or above, needs to use a three dimensional capacitance structure, such as a stack-type capacitor or a trench type capacitor, in order to realize a structure with reduced surface area requirements.

FIG. 3 is a cross-sectional diagram illustrating the structure of a conventional stack-type capacitor. On a substrate 10, a field oxide layer 11, a gate oxide layer 12, a gate electrode layer 13, and source and drain electrode areas 14 are formed in sequence to construct a transfer transistor T. Next, an insulating layer 15 is formed and a contact opening is formed by etching the source-drain electrode areas 14. Thereafter, a first polysilicon layer 6, which is used as a storage electrode, a dielectric layer 7 and a second polysilicon layer 8, which is used as an opposed electrode, are formed in sequence on the device. In this way, a DRAM memory cell with stack-type capacitor C is completed. A memory cell should offer enough capacitance to assure the operational quality of the device as the size of the device is diminished. However, when a memory cell is even more highly integrated, such as when fabricating a DRAM with a storage capacity of 64 MB or above, the above mentioned structure of a stack-type capacitor is no longer adequate.

FIG. 4 is a cross-sectional diagram illustrating a structure of conventional trench-type capacitor C. First, a transfer transistor T is formed on a substrate 10 by ordinary processing, including a gate oxide layer 12, a gate electrode layer 13, and source and drain electrode areas 14. On the surface of the substrate 10, a deep trench is etched on the side adjacent to the drain electrode 14. Next, a storage capacitor C is formed within the deep trench. The storage capacitor C includes a dielectric layer 7, an opposed electrode polysilicon layer 8 and a storage electrode 6 which is formed by the sidewalls of the substrate 10. However, to raise the capacitance, the structure and the fabricating method of this kind of capacitor may increase the surface area of electrode. Further, during the forming of the deep trench by etching, lattice defects will be generated on the substrate that increase current leakage and influence the characteristics of devices. Also, as the aspect ratio is increased, the etching rate will be decreased which adds to the difficulty of processing and adversely affects the efficiency of production.

SUMMARY OF THE INVENTION

It is therefore an object of the present invention to provide a method of fabricating DRAM memory cells which maintains the required capacitance for high levels of integration while the horizontal dimensions of the storage capacitor are decreased.

It is therefore another object of the present invention to provide a method of fabricating a DRAM memory cell to form a capacitor structure with a storage electrode having a vertical frame and a horizontal plate, wherein the horizontal plate has a plurality of extending areas extending out vertically on upper and lower surfaces thereof to increase the surface area of the storage electrode and raise its capacitance.

According to a first aspect of the present invention, a method of fabricating a DRAM memory cell which achieves the above-identified objects includes the following steps. A transfer transistor having a gate electrode and source-drain electrode areas is formed on a semiconductor substrate. First, second and third insulating layers are formed in sequence on the semiconductor substrate and the transfer transistor. The first, second and third insulating layers (in reverse order) are selectively etched through down to the surface of the transfer transistor to form a contact opening exposing one of the source-drain electrode areas as a contact area. The upper portion of the third insulating layer is etched to form a plurality of first trenches. A first conductive layer is formed over the insulating layers filling the contact opening and the plurality of first trenches. An upper portion of the first conductive layer is etched to form a plurality of second trenches. The first conductive layer is thereby defined to have a vertical frame and a horizontal plate. The vertical frame extends to the contact area through the contact opening. The horizontal plate has a plurality of extending areas extending out vertically from its upper and lower surfaces by virtue of the first and second trenches. A pattern area of the storage electrode of a capacitor is defined by selectively etching the first conductive layer. Using the second insulating layer as an etching stop, the third insulating layer is removed by isotropic etching. A dielectric layer is formed on the exposed surface of the storage electrode. A second conductive layer, which acts as an opposed electrode of the capacitor, is formed on the dielectric layer, thus completing the DRAM memory cell fabrication process according to this aspect of the invention.

According to a second aspect of the present invention, a method of fabricating a DRAM memory cell which achieves the above-identified objects, includes the following steps. A transfer transistor having a gate electrode and source-drain electrode areas is formed on a semiconductor substrate. First, second and third insulating layers are formed in sequence on the semiconductor substrate and the transfer transistor. The third, second, and first insulating layers are, in this order, etched through down to the surface of the substrate to form a contact opening exposing one of the source-drain electrode areas as a contact area. A columnar conductive layer is formed filling the contact opening. An upper portion of the third insulating layer is etched to form a plurality of first trenches. A first conductive layer is formed extending over the third insulating layer and filling the first trenches. An upper portion of the first conductive layer is etched to form a plurality of second trenches, so that both upper and lower surfaces of the first conductive layer then have a plurality of extending areas extending out vertically therefrom. The pattern of the first conductive layer is defined by selectively etching the first conductive layer, forming the storage electrode of a capacitor which includes the columnar conductive layer and the first conductive layer having the plurality of extending areas. Using the second insulating layer as an etching stop, the third insulating layer is removed by isotropic etching. A dielectric layer is formed on the exposed surfaces of the storage electrode. A second conductive layer, which acts as an opposed electrode of the capacitor, is formed on the dielectric layer, thus completing the DRAM memory cell fabrication process according to this aspect of the invention.

According to a third aspect of the present invention, a method of fabricating a DRAM memory cell which achieves the above-identified objects, includes the following steps. A transfer transistor having a gate electrode and source-drain electrode areas is formed on a semiconductor substrate. First and second insulating layers are formed in sequence on the semiconductor substrate and the transfer transistor. The second and first insulating layers are, selectively etched through down to the surface of the semiconductor substrate to form a first contact opening exposing one of the source-drain electrode areas as a contact area. A first conductive layer is formed extending over the second insulating layer and filling the first contact opening. A third insulating layer is formed on the first conductive layer. A second contact opening is formed in the third insulating layer down the first conductive layer. An upper portion of the third insulating layer is also etched to form a plurality of first trenches. A second conductive layer is formed extending over the third insulating layer, and filling the second contact opening and the plurality of the first trenches. An upper portion of the second conductive layer is etched to form a plurality of second trenches. The structure of the second conductive layer is thus defined to have a vertical frame coupled to the contact area through the first and second contact openings, and a horizontal plate with a plurality of extending areas. Using the second insulating layer as an etching stop, the second conductive layer, the third insulating layer and the first conductive layer are etched in sequence to define the pattern of the second conductive layer. The storage electrode of a capacitor thus includes the second and the first conductive layers. The third insulating layer is removed by isotropic etching, and a dielectric layer is formed on the exposed surface of the storage electrode. A third conductive layer, which acts as an opposed electrode of the capacitor, is formed on the dielectric layer, thus completing the memory cell fabrication process according to the invention.

According to a fourth aspect of the present invention, a method of fabricating a DRAM memory cell which achieves the above-identified objects includes the following steps. A transfer transistor having a gate electrode and source-drain electrode areas is formed on a semiconductor substrate. First, second and third insulating layers are formed in sequence on the semiconductor substrate and the transfer transistor. The third, second and first insulating layers are selectively etched through down to the surface of the semiconductor substrate to form a contact opening exposing one of the source-drain electrode areas as a contact area. A first conductive layer is formed extending over the surface of the third insulating layer and filling the contact opening. A fourth insulating layer is formed over the first conductive layer, and a second contact opening is formed in the fourth insulating layer down to the surface of the first conductive layer. An upper portion of the fourth insulating layer is etched to form a plurality of first trenches. A second conductive layer is formed extending over the fourth insulating layer, and filling the second contact opening and the plurality of first trenches. An upper portion of the second conductive layer is etched to form a plurality of second trenches, and the structure of the second conductive layer is thus defined to have a vertical frame and a horizontal plate. The vertical frame is coupled to the contact area through the first and second contact openings. The horizontal plate has a plurality of extending areas extending out vertically on its upper and lower surfaces. Using the second insulating layer as an etching stop, the second conductive layer, the fourth insulating layer, the first conductive layer and the third insulating layer are etched in sequence to define a pattern area of a storage electrode of a capacitor, which includes the second and first conductive layers. The fourth and the third insulating layers are removed by isotropic etching, and a dielectric layer is formed on the exposed surface of the storage electrode. A third conductive layer, which acts as an opposed electrode of the capacitor, is formed on the dielectric layer, thus completing the memory cell fabrication process according to this aspect of the invention.

The extending areas extending out vertically from the horizontal plate may be disposed symmetrically or asymmetrically on the upper and/or lower surfaces of the horizontal plates.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DETAILED DESCRIPTION OF THE PREFERRED EMBODIMENTS

Embodiment 1

Figure 1:
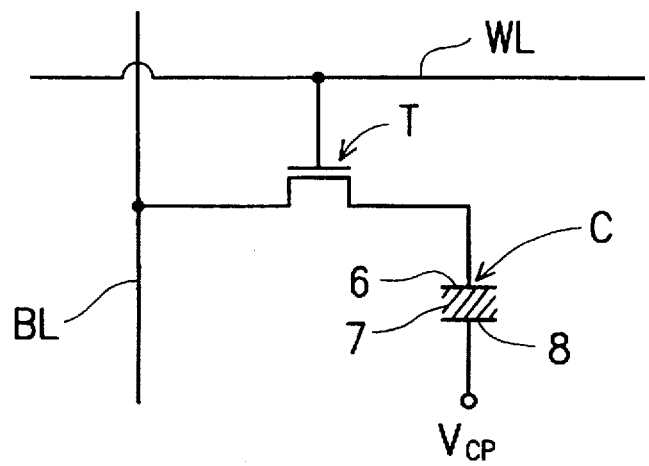
FIG. 1 is a circuit diagram illustrating a conventional DRAM memory cell.
Figure 2:
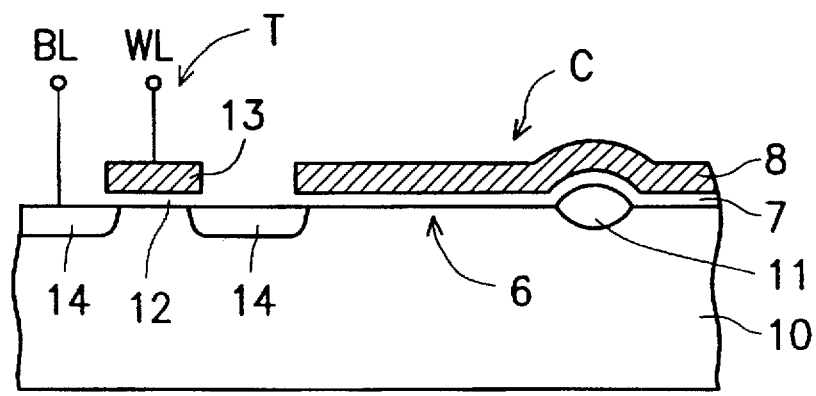
FIG. 2 is a cross-sectional diagram illustrating the structure of a conventional DRAM memory cell with a planar-type capacitor.
Figure 3:
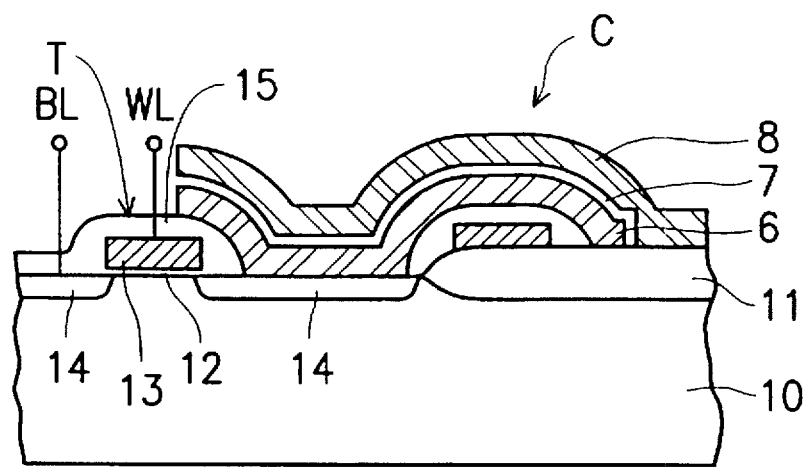
FIG. 3 is a cross-sectional diagram illustrating the structure of a conventional DRAM memory cell with a stack-type capacitor.
Figure 4:
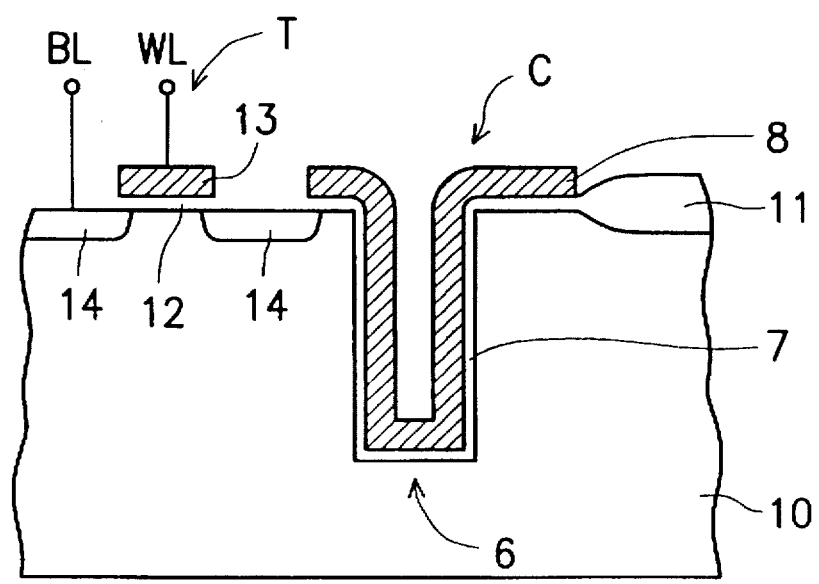
FIG. 4 is a cross-sectional diagram illustrating the structure of a conventional memory cell with a trench-type capacitor.

As shown in FIG. 2, conventionally a field oxide layer 11 is formed on a silicon substrate 10 to define the area of an active region. Next, gate oxide layer 12, polysilicon gate electrode layer 13 and doped source-drain areas 14 are formed in sequence to construct the transfer transistor T. Up to this point in the process, the method according to the invention is same as the conventional process of FIG. 2. For convenience and simplification in illustrating the invention, the above mentioned structure of the transfer transistor, etc., will be illustrated only as a flat substrate 20 in FIGS. 5A to 5E.

Figure 5A:
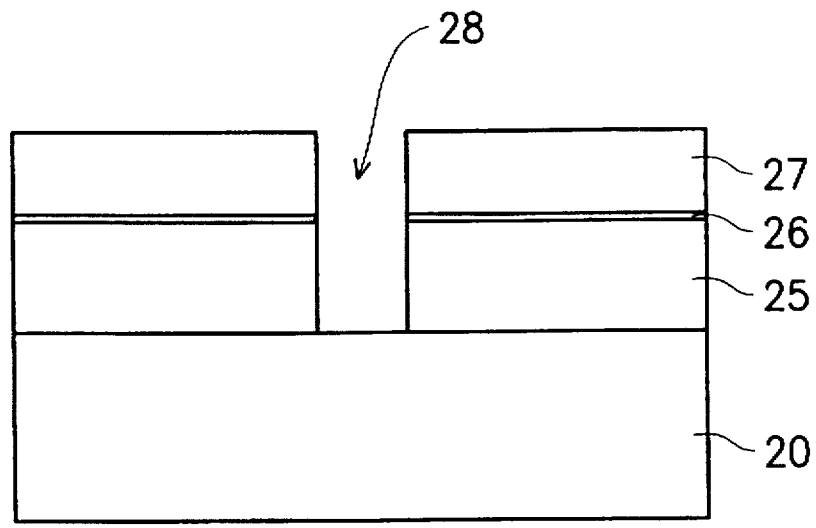
FIGS. 5A to 5F are cross-sectional diagrams illustrating the memory cell fabrication process of a first preferred embodiment according to the present invention.

Referring FIG. 5A, a first insulating layer 25, a second insulating layer 26 and a third insulating layer 27 are formed in sequence on the substrate 20. For example, first, a borophosphosilicate glass first insulating layer 25 is formed to a thickness of about 7000Å as a passivation layer by chemical vapor deposition (CVD). Next, a silicon nitride second insulating layer 26 is deposited with a thickness of about 1000Å as a etching protecting layer by CVD. Then, after depositing a silicon oxide third insulating layer 27 with a thickness of about 7000Å, the third, second, and first insulating layers 27, 26 and 25 are selectively etched through down to the surface of the substrate 20 to form a contact opening 28 exposing one of the source-drain electrode areas (not shown in FIG. 5, but refer to 14 in FIG. 2 for example) as a contact area.

Figure 5B:
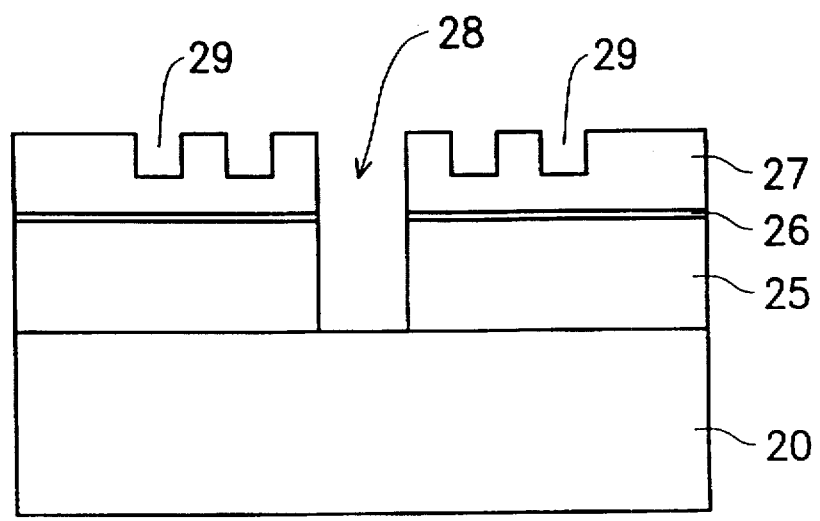

Referring to FIG. 5B, using photolithography and etching, a plurality of first trenches 29 are formed on an upper portion of the third insulating layer 27. For example, the upper portion of the above mentioned silicon oxide layer 27 is etched by reactive ion etching (RIE) to a predetermined depth. The shape of the first trenches 29 could be rectangular, cylindrical or polygonal, for example, and the number of trenches may be adjusted as needed.

Figure 5C:
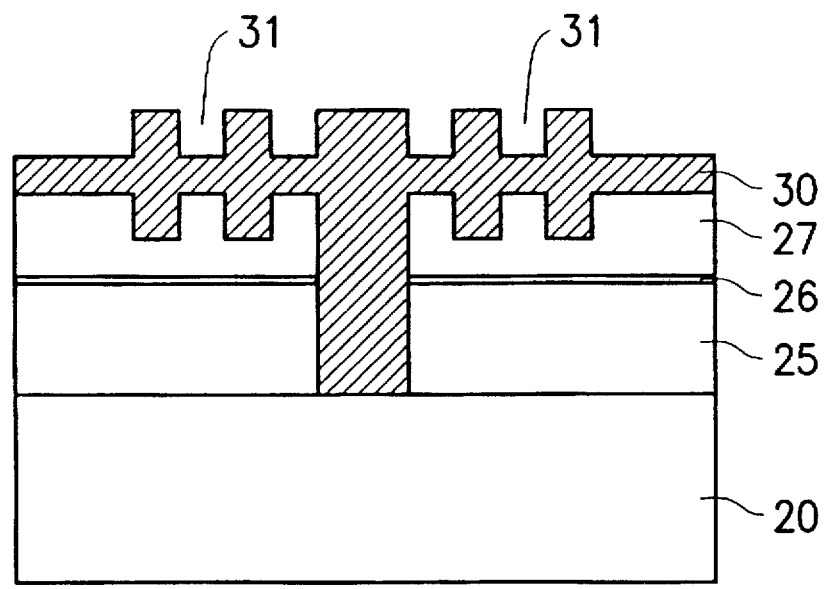

As shown in FIG. 5C, a first conductive layer 30 is formed over the third insulating layer 27 filling the contact opening and the plurality of first. trenches 29. For example, a polysilicon first conducting layer 30 is deposited with a thickness of about 7000Å by CVD. Thereafter, a plurality of second trenches 31 are formed on an upper portion of the first conductive layer 30. The shape of the second trenches 31 could be rectangular, cylindrical or polygonal, for example. Also, in the illustrated exemplary embodiment, the second trenches and the first trenches are disposed to be complementary to each other.

Figure 5D:
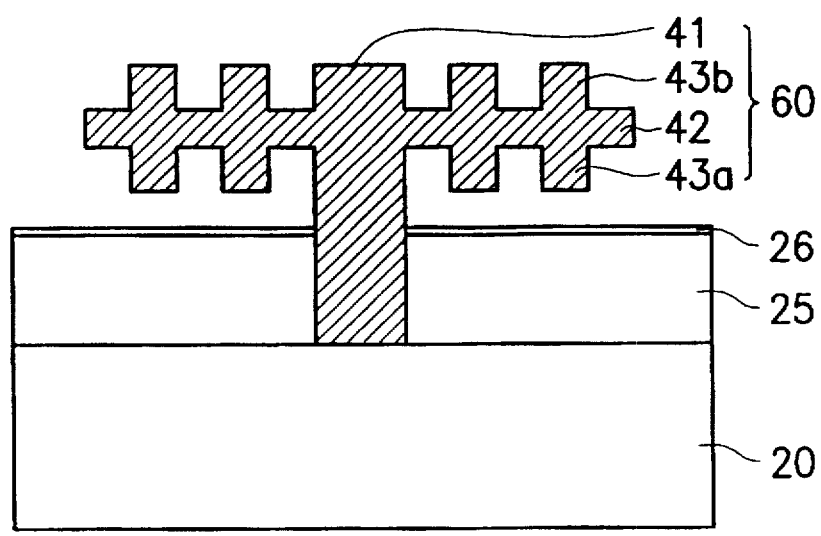

As illustrated in FIG. 5D, using photoresist mask (not shown), the first conductive layer 30 is etched by anisotropic etching, e.g., reactive ion etching, to define a pattern area of the capacitor. After the photoresist is removed, using the second insulating layer 26 (silicon nitride) as an etching stop, the third insulating layer 27 (silicon oxide layer) is removed by isotropic etching, e.g., wet etching using, for example, HF (hydrofluoric acid) or B.O.E.(buffered oxide etchant). Up to this point in the process, the structure of the first conductive layer 30 defines the storage electrode 60 of a capacitor including a vertical frame 41 and a horizontal plate 42. The vertical frame 41 is coupled to the contact area of the substrate 20 through the contact opening 28. The horizontal plate 42 has a plurality of extending areas 43a and 43b which bulge out (extend) vertically and are disposed symmetrically on its upper and lower surfaces as shown.

Figure 5E:
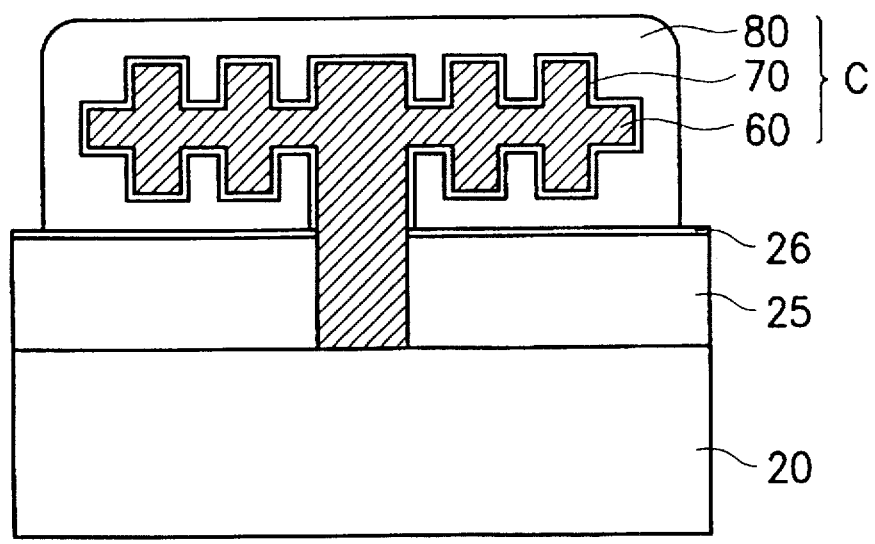

As shown in FIG. 5E, a dielectric layer 70 is formed on the storage electrode 60. The dielectric layer 70 could be a two layer structure, e.g., silicon nitride/silicon dioxide (NO) layers, or a three layer structure, e.g., silicon dioxide/silicon nitride/silicon dioxide (ONO) layers or other materials could be used, such as tantalum oxide, barium titanic acid, or strontium titanic acid. On the surface of the dielectric layer 70, an opposed electrode 80 is formed, thus completing the fabrication of the capacitor of a DRAM memory cell. For example, opposed electrode 80 could be a polysilicon layer deposited to a thickness of about 1000Å by CVD. The polysilicon layer 80 could also be implanted with impurities to increase conductivity. Then, a pattern area of the polysilicon layer 80 is defined by photolithography and etching to form the opposed electrode of the capacitor C. The above mentioned storage electrode 60, the dielectric layer 70 and the opposed electrode 80 together form capacitor C.

For convenience and simplification of description and illustration, the semiconductor substrate 20 is shown flat in the figures. That is, any roughness of the surface caused by the field oxide layer 11 and the polysilicon gate layer 13 is not shown in the previous figures. When considering the surface roughness, the structure of the DRAM memory cell according to the present invention will be the structure illustrated in FIG. 5F. It is clear that in either FIGS. 5E or 5F, the horizontal plate 42 of the storage electrode 60 has a plurality of extending areas on its upper and lower surfaces that increase the surface area of the storage electrode 60 to provide more capacitance within the same horizontal dimensions. By controlling the quantity of extending areas 43a and 43b to thereby adjust the surface area of the storage electrode 60, the required capacitance is achieved.

Embodiment 2

First, performing the process steps as shown in FIGS. 5A to 5B and already described, a first insulating layer 25, a second insulating layer 26 and a third insulating layer 27 are formed in sequence on a substrate 20, and etched to form a contact opening 28 and a plurality of first trenches 29. Next, referring to FIG. 6A, a first conductive layer 30 is formed over the third insulating layer 27 filling the contact opening 28 and the first trenches 29. For example, a polysilicon conducting layer 30 is deposited to a thickness of about 7000Å by CVD. Thereafter, using photolithography and etching, a plurality of second trenches 31 are formed on an upper portion of the first conductive layer 30. The shape of the second trenches 31 could be rectangular, cylindrical or polygonal, for example, and the number of second trenches could be adjusted as needed.

Performing the process shown in FIG. 5D of embodiment 1, a pattern area of the first conductive layer 30 is defined by anisotropic etching to construct the storage electrode 60 of a capacitor. The third insulating layer 27 is removed by isotropic etching to obtain a structure with a vertical frame 41 and a horizontal plate 42, as shown in FIG. 6B. The vertical frame 41 is coupled to the contact area of the substrate 20 through the contact opening 28. The horizontal plate 42 has a plurality of extending areas 43a and 43b which extend out vertically and are disposed asymmetrically on the upper and lower surfaces of the horizontal plate 42.

Figure 6A:
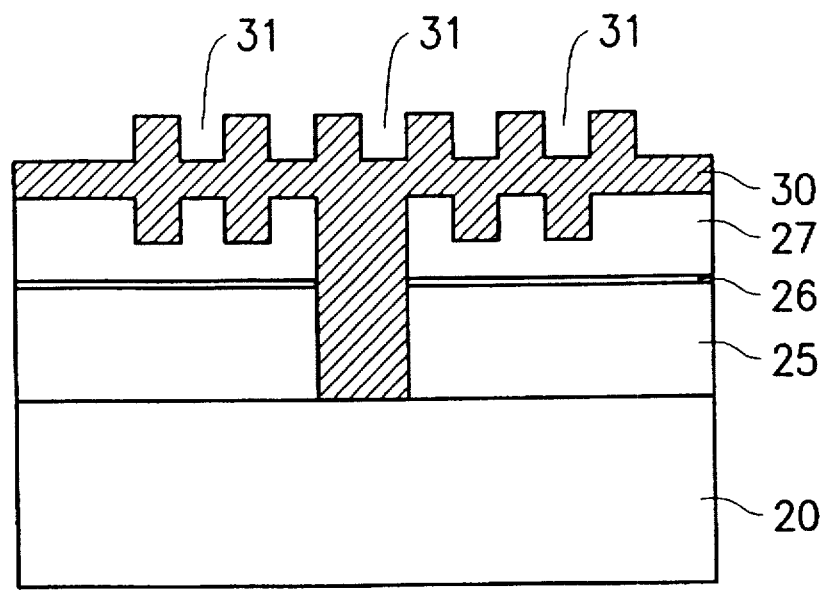
FIGS. 6A to 6D are cross-sectional diagrams illustrating the memory cell fabrication process of a second preferred embodiment according to the present invention.
Figure 6B:
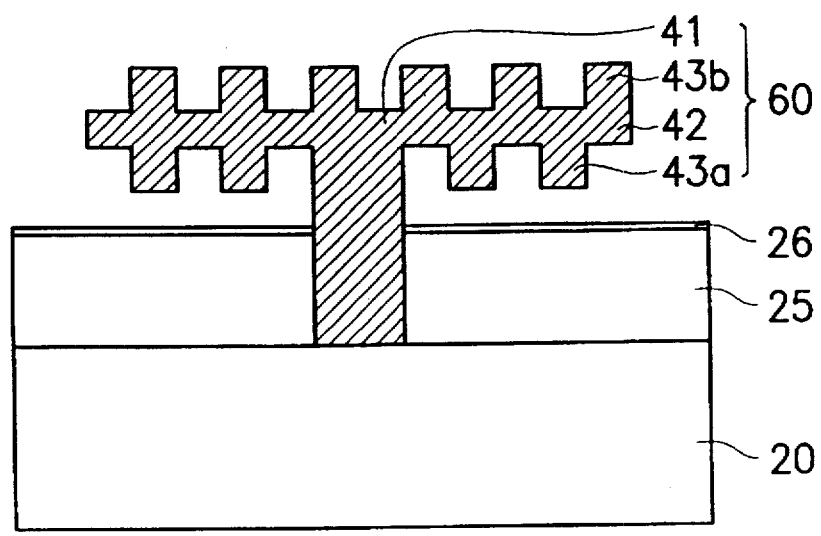
Figure 6C:
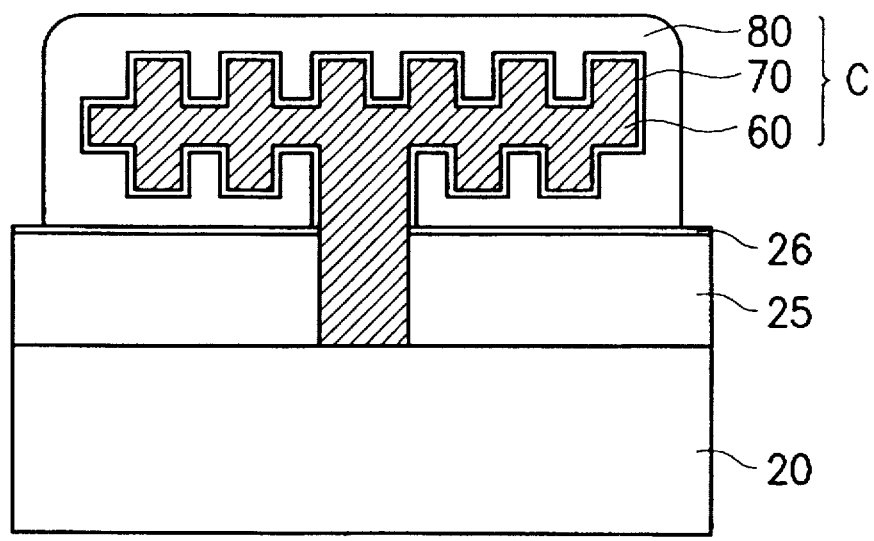

As shown in FIG. 6C, a dielectric layer 70 is formed on the storage electrode 60. The dielectric layer 70 could be a two layer structure, e.g., silicon nitride/silicon dioxide (NO) layers, or a three layer structure, e.g., silicon dioxide/silicon nitride/silicon dioxide (ONO) layers or other materials, such as tantalum oxide, barium titanic acid, or strontium titanic acid. Thereafter, a polysilicon layer is deposited to a thickness of about 1000Å by CVD. The polysilicon layer could be implanted with impurities to increase conductivity. Then, a pattern area of the polysilicon layer is defined by photolithography and etching to form opposed electrode 80 of the capacitor. The storage electrode 60, the dielectric layer 70 and the opposed electrode 80 together form a capacitor C, thus completing the process of fabricating a DRAM memory cell.

Figure 6D:
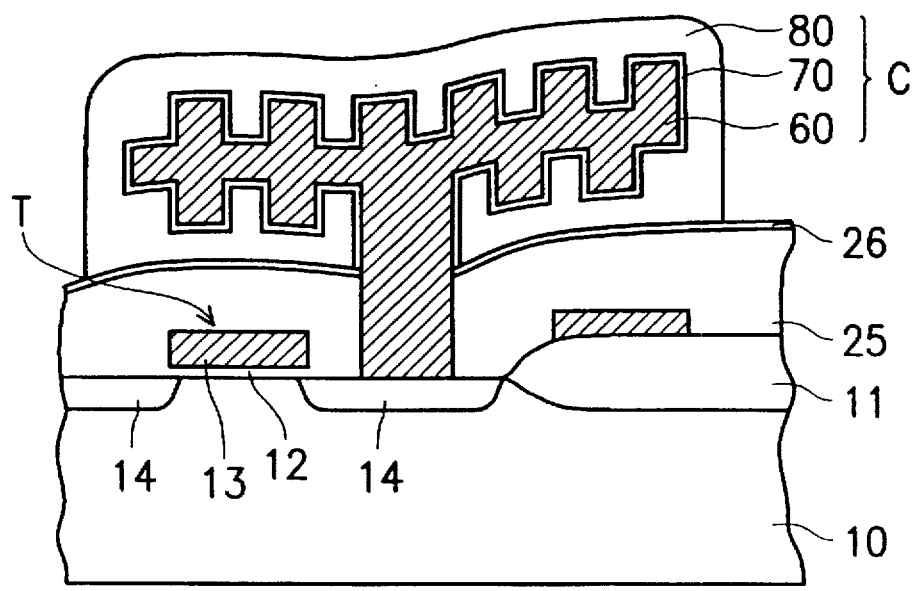

For the convenience of description and illustration, the semiconductor substrate 20 is shown flat in FIGS. 6A to 6C. However, considering surface roughness, the structure of the DRAM memory cell according to the present invention would be the structure as shown in FIG. 6D. It is clear that in FIGS. 6C or 6D, the horizontal plate 42 of the storage electrode 60 has a plurality of extending areas on the upper and lower surfaces that could increase the surface area of the storage electrode 60 to provide more capacitance within the same horizontal dimensions.

Embodiment 3

In the first and second exemplary embodiments, since the first conductive layer 30 is deposited to fill the contact opening 28 and the first trenches 29 at the same time, as the depth difference between the contact opening 28 and the first trenches 29 increases, it becomes difficult to obtain a planar surface. Thus, the third exemplary embodiment is provided as another solution to the stated problem.

Figure 7A:
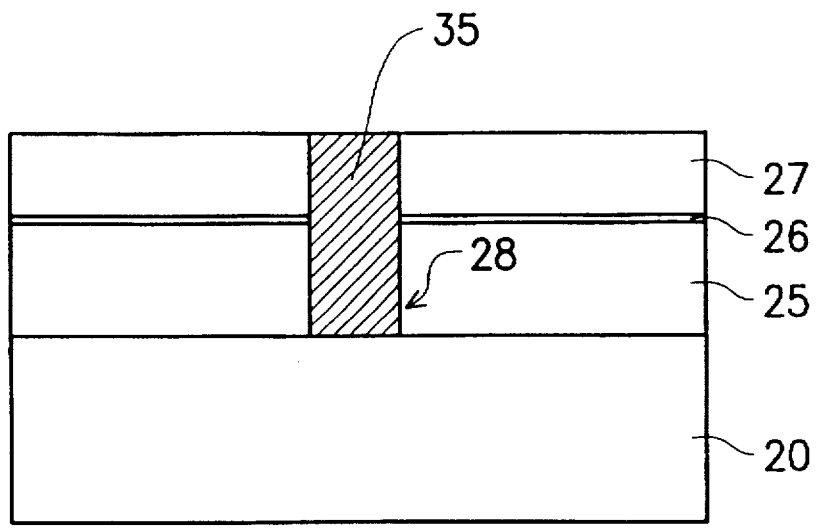
FIGS. 7A to 7B are cross-sectional diagrams illustrating the memory cell fabrication process of a third preferred embodiment according to the present invention.

Referring to FIG. 7A, a substrate 20 is provided having a field oxide layer, a gate oxide layer, a gate polysilicon layer and source-drain electrode areas, which are not shown for simplification of illustration and explanation. A first insulating layer 25, a second insulating layer 26, and a third insulating layer 27, e.g., a borophosphosilicate glass layer 25, a silicon nitride layer 26 and a silicon oxide layer 27, are formed on substrate 20 in sequence. A contact opening 28 is formed by photolithography and etching exposing one of the source-drain electrode areas as a contact area. Thereafter, a columnar conductive layer 35, e.g., a polysilicon layer, is formed to fill the contact opening 28 by CVD.

Figure 5F:
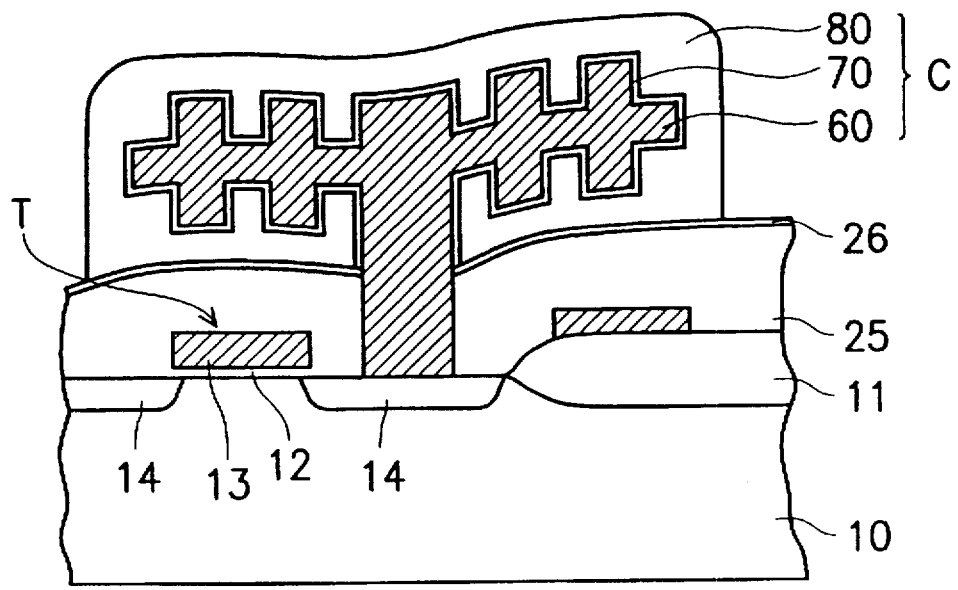
Figure 7B:
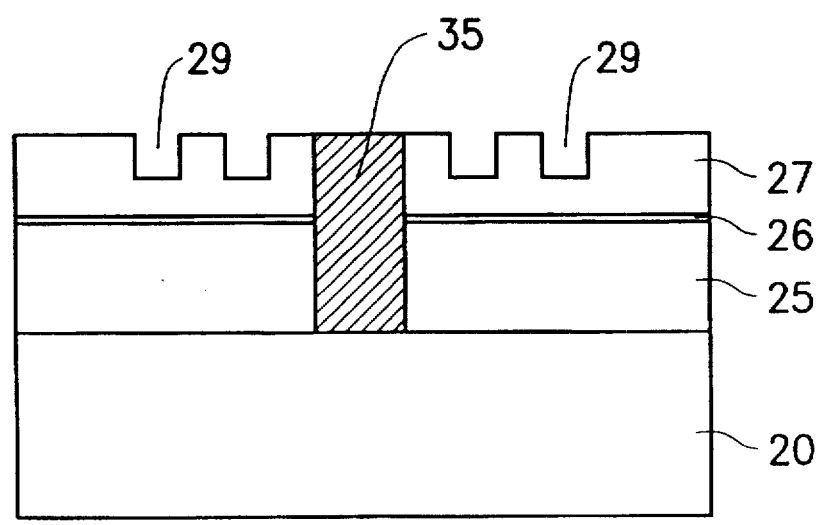

In FIG. 7B, using photolithography and etching, a plurality of a first trenches 29 are formed on an upper portion of the third insulating layer 27. Thereafter, performing the processing as shown in FIGS. 5C to 5E, or the processing as shown in FIGS. 6A to 6C, a DRAM structure, as shown in FIGS. 5F or 6D, will be obtained. The structure formation according to this embodiment is easier to perform because the first conductive layer is here only formed to fill the first trenches 29 and not to also fill the contact opening. The storage electrode 60 is constructed by the columnar conductive layer 35 and the first dielectric layer 30. The capacitance is raised due to the horizontal plate having a plurality of extending areas on its upper and lower surfaces.

Embodiment 4

As shown in FIG. 2, conventionally a field oxide layer 11 is formed on a silicon substrate 10 to define the area of an active region. Next, a gate oxide layer 12, a gate polysilicon layer 13 and doped source-drain areas 14 are formed in sequence to construct a transfer transistor T. Up to this point, the method according to the invention is same as the conventional process of FIG. 2. For convenience of description and simplification in illustrating the invention, the above mentioned structure of the transfer transistor, etc., will be shown only as a flat substrate 20 in FIGS. 8A to 8E.

Figure 8A:
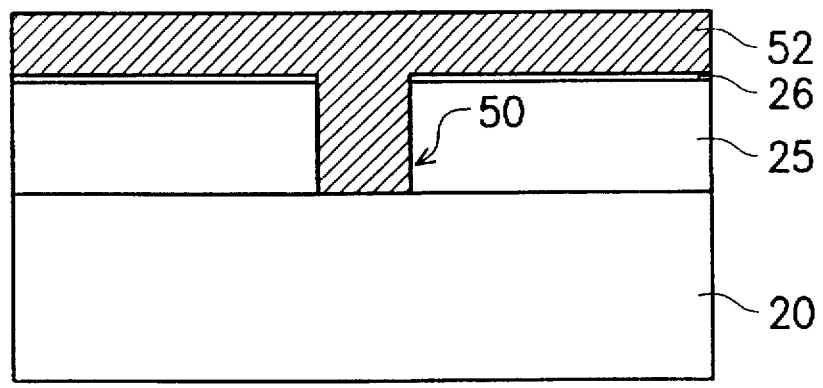
FIGS. 8A to 8F are cross-sectional diagrams illustrating the memory cell fabrication process of a fourth preferred embodiment according to the present invention.

Referring to FIG. 8A, a first insulating layer 25 and a second insulating layer 26 are deposited in sequence on the substrate 20. For example, first, a borophosphosilicate glass first insulating layer 25 is deposited to a thickness of about 7000Å as a passivation layer by chemical vapor deposition (CVD). Next, a silicon nitride second insulating layer 26 is deposited by CVD to a thickness of about 1000Å as a etching protecting layer. The second and first insulating layers 26, 25 are selectively etched through down to the surface of the substrate 20 to form a first contact opening 50 exposing one of the source-drain electrode areas (not shown) as a contact area. Then, a first conductive layer 52, e.g., a polysilicon layer, is formed over the second insulating layer 26 to a thickness of about 5000Å by CVD filling the first contact opening 50. The polysilicon layer 52 contacts the contact area of the substrate through the first contact opening 50.

Figure 8B:
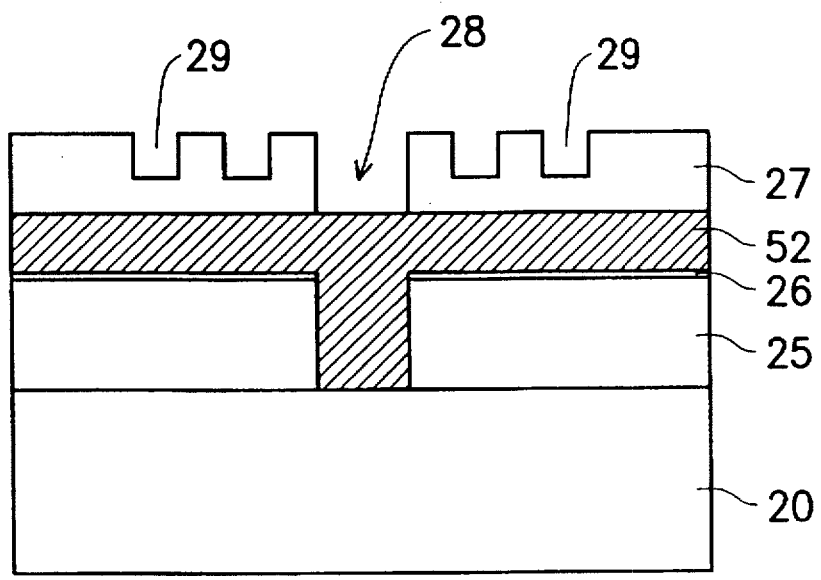

Referring next to FIG. 8B, a third insulating layer 27 is formed over the first conductive layer 52. For example, a silicon oxide third insulating layer 27 is deposited to a thickness of about 7000Å by CVD. Using photolithography and etching, a second contact opening 28 is formed on the third insulating layer 27 directly above the first contact opening 50 exposing the surface of the conductive layer 52, and a plurality of first trenches 29 are formed on an upper portion of the third insulating layer 27. The shape of the first trenches 29 could be rectangular, cylindrical or polygonal, for example, and the number of first trenches 29 can be adjusted as needed.

Figure 8C:
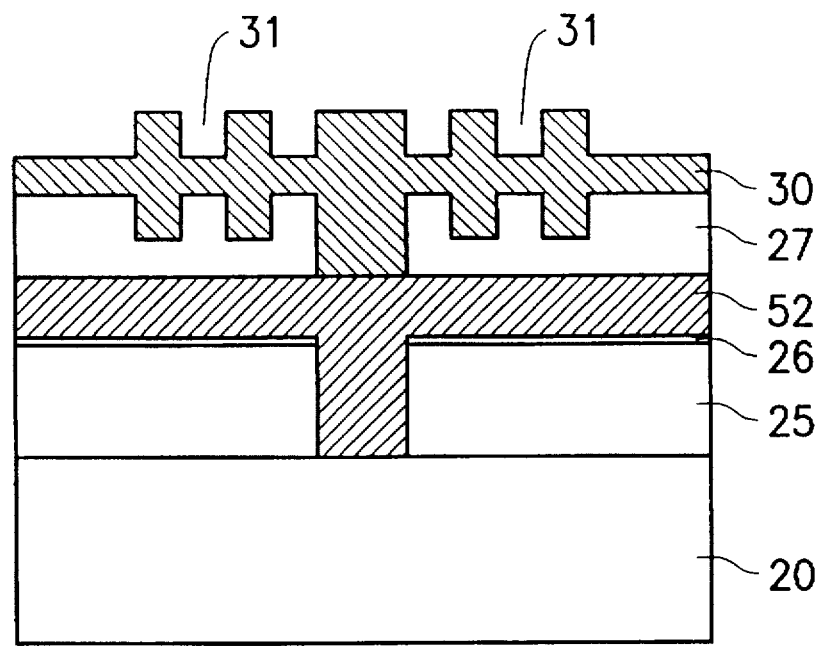

As shown in FIG. 8C, a second conductive layer 30 is formed over the third insulating layer 27 filling the second contact opening 28 and the plurality of first trenches 29. For example, a polysilicon second conductive layer 30 is deposited to a thickness of about 7000Å by CVD and coupled to the first conductive layer 52 through the second contact opening 28. Thereafter, a plurality of second trenches 31 are formed on an upper portion of the second conductive layer 30. The shape of the second trenches 31 could be rectangular, cylindrical or polygonal, and their number can be adjusted as needed. As illustrated, in this exemplary embodiment, the second trenches and the first trenches are disposed to be complementary to each other.

Figure 8D:
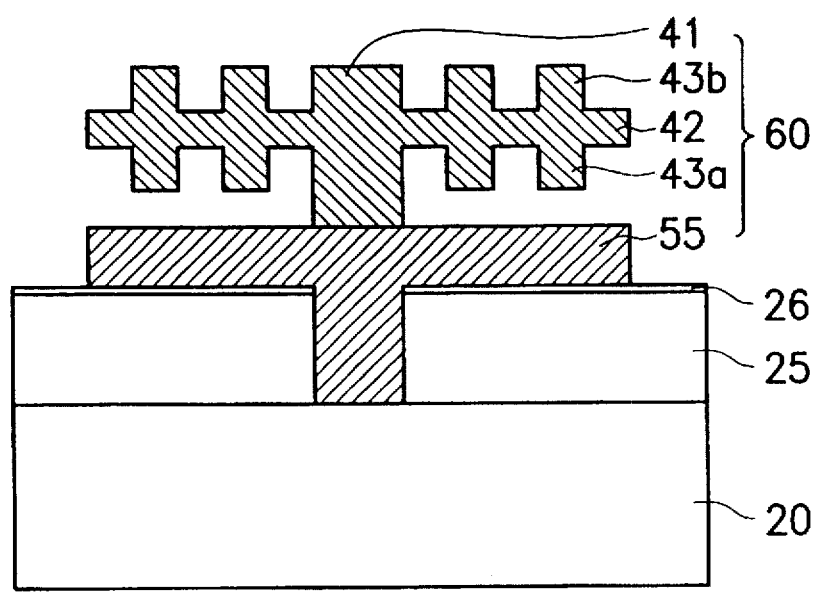

As illustrated in FIG. 8D, using a photoresist mask (not shown), the second conductive layer 30, the third insulating layer 27 and the first conductive layer 52 are etched by anisotropic etching, e.g., reactive ion etching, to define a pattern area of the capacitor. After the photoresist is removed, using the second insulating layer 26 (silicon nitride) as an etching stop, the third insulating layer 27 (silicon oxide layer) is removed by isotropic etching, e.g., wet etching using for example, HF (hydrofluoric acid) or B.O.E.(buffered oxide etchant). Up to this point in the process, the structure of the first and second conductive layers 52, 30 defines the storage electrode 60 of a capacitor, which includes a vertical frame 41, a first horizontal plate 55 and a second horizontal plate 42. The vertical frame 41 contacts the contact area of the substrate 20 through the contact openings 28 and 50. The first and second horizontal plates 55, 42 are formed apart in sequence and extend parallel with the surface of the second insulating layer 26. The second horizontal plate 42 has a plurality of extending areas 43a and 43b extending out vertically and formed symmetrically on the upper and lower surfaces of the horizontal plate 42 as shown.

Figure 8E:
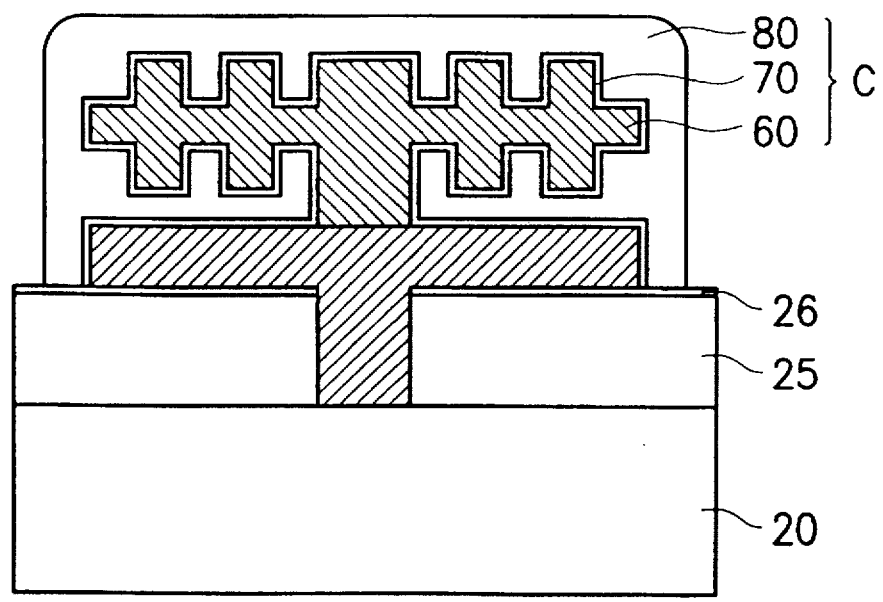

As illustrated in FIG. 8E, a dielectric layer 70 is formed over the exposed surface of the storage electrode 60. The dielectric layer 70 could be a two layer structure, e.g., silicon nitride/silicon dioxide (NO) layers, or a three layer structure, e.g., silicon dioxide/silicon nitride/silicon dioxide (ONO) layers or other materials could be used such as tantalum oxide, barium titanic acid, or strontium titanic acid. On the surface of the dielectric layer 70, an opposed electrode 80 is formed, thus completing the fabrication of the capacitor of a DRAM memory cell. For example, a polysilicon layer is deposited to a thickness of about 1000Å by CVD. The polysilicon layer could be implanted with impurities to increase conductivity. Then, a pattern area of the polysilicon layer is defined by photolithography and etching to form opposed electrode 80 of the capacitor. Thus, the storage electrode 60, the dielectric layer 70 and the opposed electrode 80 together form capacitor C.

Figure 8F:
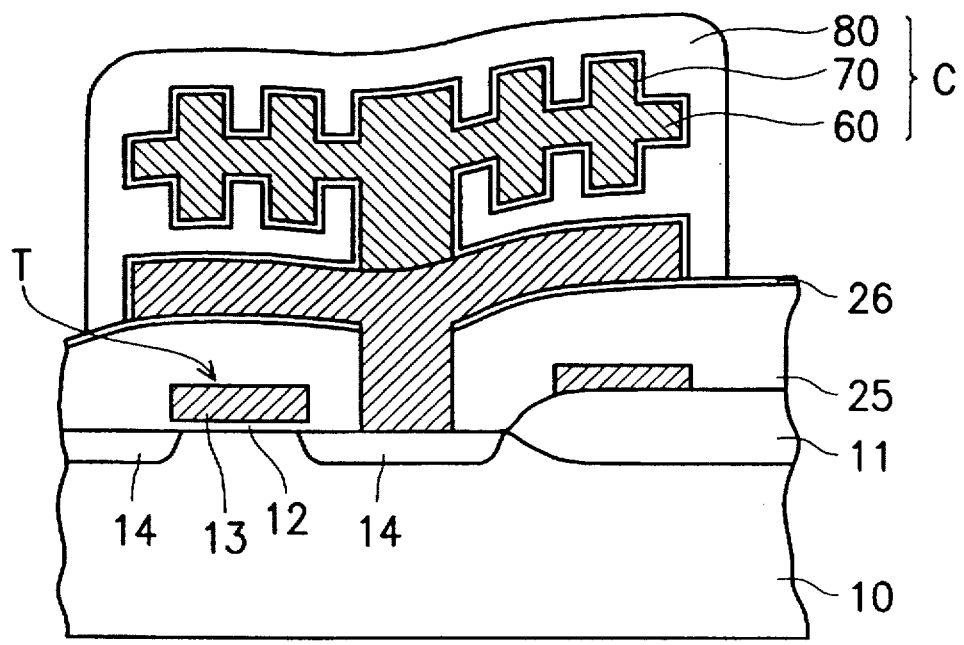

When considering the roughness caused by field oxide layer 11 and polysilicon gate layer 13, for example, the structure of the DRAM memory cell according to the present invention will be the structure as shown in FIG. 8F. It is clear that in either FIGS. 8E or 8F, the second horizontal plate 42 of the storage electrode 60 formed with a plurality of extending areas on both the upper and lower surfaces, increases the surface area of the storage electrode 60. Since the first horizontal plate 55 provides an additional surface, the capacitance of this embodiment is significantly higher than the capacitance of embodiments 1, 2 and 3 for example.

Embodiment 5

Figure 9A:
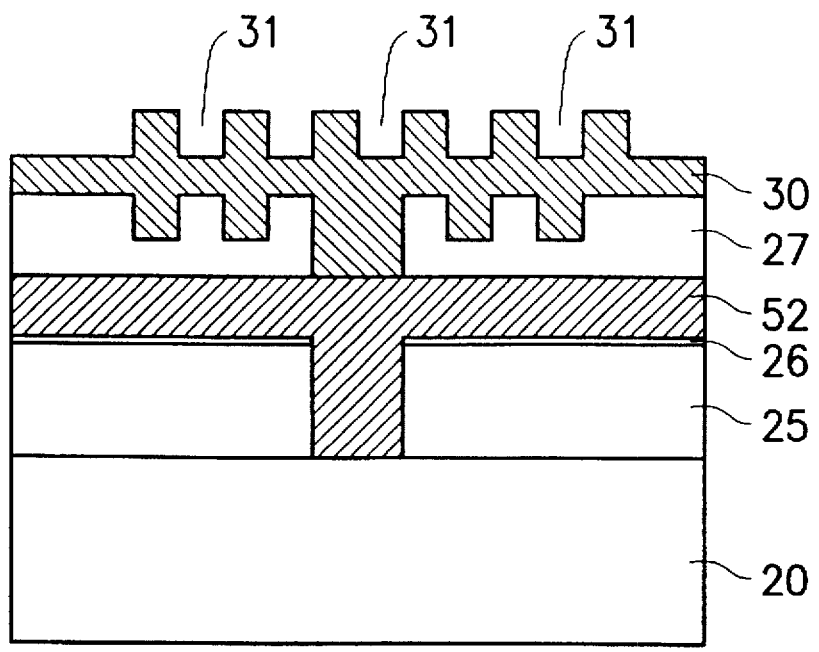
FIGS. 9A to 9D are cross-sectional diagrams illustrating the memory cell fabrication process of a fifth preferred embodiment according to the present invention.

This exemplary embodiment is based on the structure and fabrication process of FIGS. 8A and 8B of exemplary embodiment 4. Referring to FIG. 9A, a second conductive layer 30 is formed over the third insulating layer 27 filling the second contact opening 28 and the plurality of first trenches 29. For example, a polysilicon second conductive layer 30 is deposited to a thickness of about 7000Å by CVD, and coupled to the first conductive layer 52 through the second contact opening 28. Then, using photolithography and etching, a plurality of second trenches 31 are formed on an upper portion of the second conductive layer 30 in a different orientation from the previous embodiment.

Figure 9B:
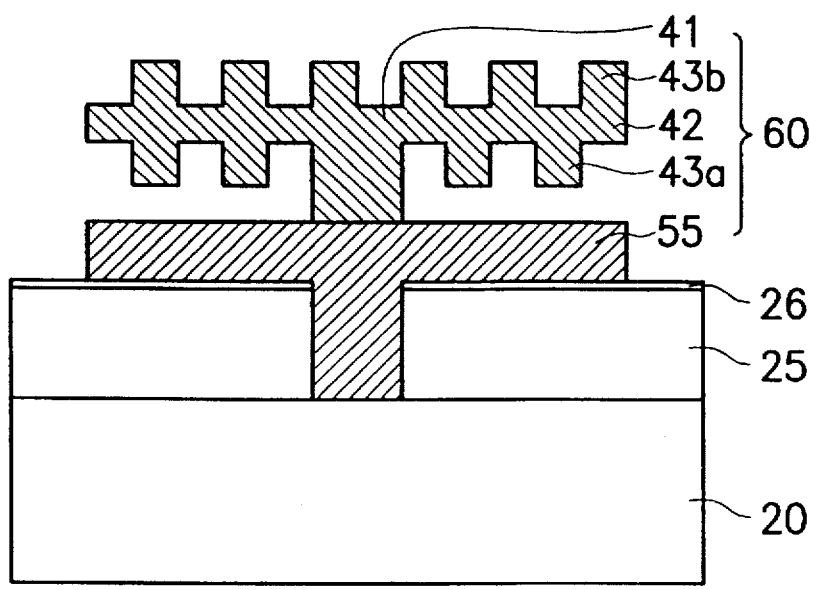

Next, performing the process as shown in FIG. 8D, using anisotropic etching, a pattern area is defined by etching the second conductive layer 30, the third insulating layer 27 and the first conductive layer 52. Then the second insulating layer 26 is removed by isotropic etching to obtain the storage electrode 60 of a capacitor as shown in FIG. 9B. The storage electrode 60 includes a vertical frame 41, a first horizontal plate 55 and a second horizontal plate 42. The vertical frame 41 is coupled to the contact area of the substrate 20 through the contact openings 28 and 50. The second horizontal plate 42 has a plurality of extending areas 43a and 43b extending out vertically from upper and lower surfaces of the horizontal plate 42, but in a different shape than in the fourth embodiment.

Figure 9C:
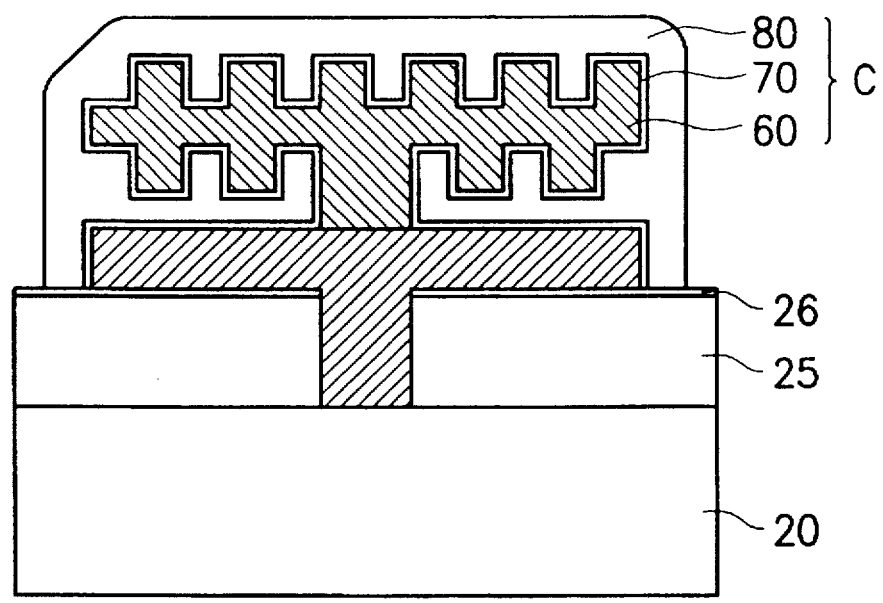
Figure 9D:
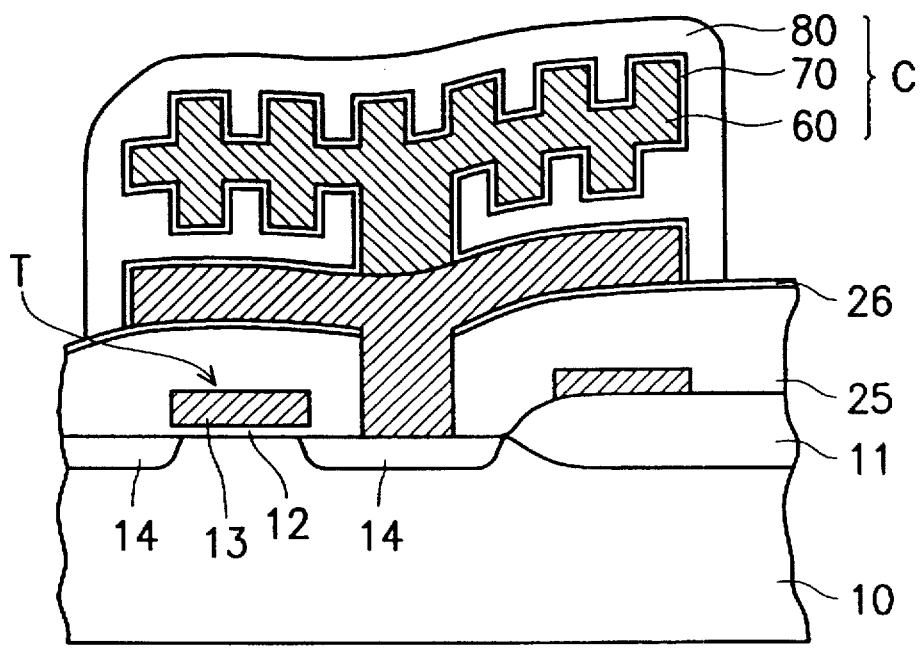

As shown in FIG. 9C, a dielectric layer 70 is formed over the exposed surface of the storage electrode 60. An opposed electrode 80 is formed on the surface of the dielectric layer 70. Thus, the storage electrode 60, the dielectric layer 70 and the opposed electrode 80 together form a capacitor C. The steps and the exemplary materials used in this process are the same as in the above previously mentioned embodiments.

When considering the roughness caused by field oxide layer 11 and polysilicon gate layer 13, for example, the structure of the DRAM memory cell according to the present invention will be the structure as shown in FIG. 9F. It is clear that in FIG. 8F, the surface area of the storage electrode 60 is significantly increased which efficiently raises the capacitance.

Embodiment 6

Figure 10A:
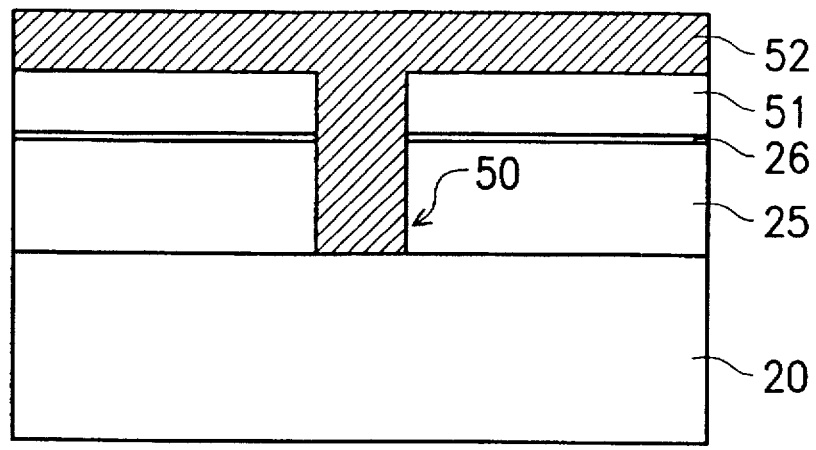
FIGS. 10A to 10F are cross-sectional diagrams illustrating the memory cell fabrication process of a sixth preferred embodiment according to the present invention.

This exemplary embodiment is based on the process and structure of exemplary embodiment 4 previously described. With reference to FIG. 10A, a first insulating layer 25, a second insulating layer 26 and a third insulating layer 51 are formed in sequence on the substrate 20. For example, a borophosphosilicate glass first insulating layer 25, a silicon nitride second insulating layer 26 and a silicon oxide third insulating layer 51 are formed by CVD. The third, second and first insulating layers 51, 26, 25 (in that order) are selectively etched through down to the surface of the substrate 20 to form a first contact opening 50 for exposing one of the source-drain electrode areas (not shown) as a contact area. Then, a first conductive layer 52, e.g., a polysilicon layer, is formed over the third insulating layer 51 to a thickness of about 5000Å by CVD also filling the first contact opening 50, and making contact with the contact area on the substrate 20 through the first contact opening 50.

Figure 10B:
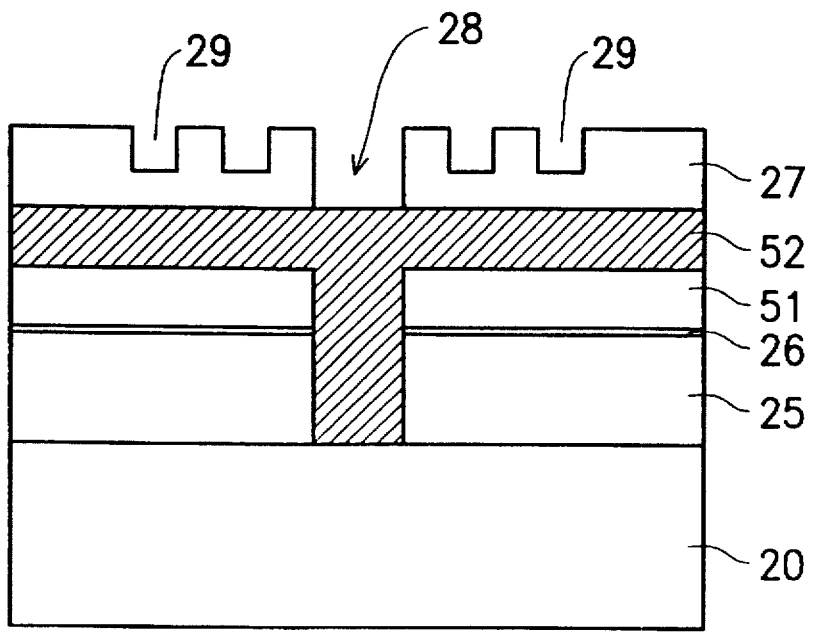

Referring to FIG. 10B, a fourth insulating layer 27 is formed over the first conductive layer 52. For example, a silicon oxide fourth insulating layer 27 is deposited to a thickness of about 7000Å by CVD. Using photolithography and etching, a second contact opening 28 is formed on the fourth insulating layer 27 directly above the first contact opening 50 exposing the surface of the first conductive layer 52, and a plurality of first trenches 29 are formed on an upper portion of the fourth insulating layer 27. The shape of the first trenches 29 may be rectangular, cylindrical or polygonal, and their number may be adjusted as needed.

Figure 10C:
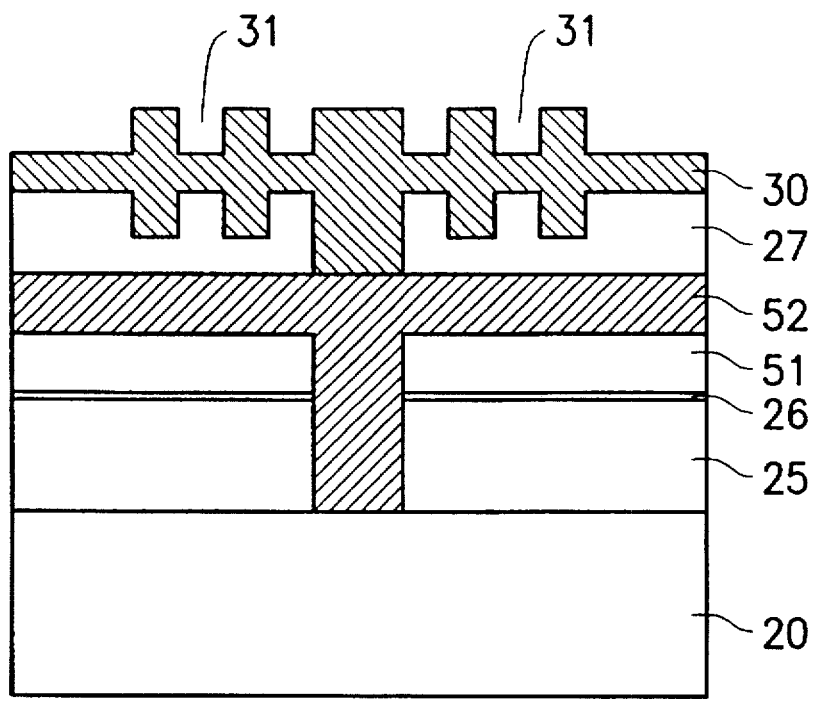

As shown in FIG. 10C, a second conductive layer 30 is formed over the fourth insulating layer 27 filling the second contact opening 28 and the plurality of first trenches 29. For example, a polysilicon layer 30 is deposited to a thickness of about 7000Å by CVD making contact with the first conductive layer 52 through the second contact opening 28. Thereafter, using photolithography and etching, a plurality of second trenches 31 are formed on an upper portion of the second conductive layer 30. The shape of the second trenches 31 may be rectangular, cylindrical or polygonal, and their number may be adjusted as needed. Also, as shown in the exemplary embodiment, the second trenches 31 and the first trenches 29 are disposed to be complementary to each other.

Figure 10D:
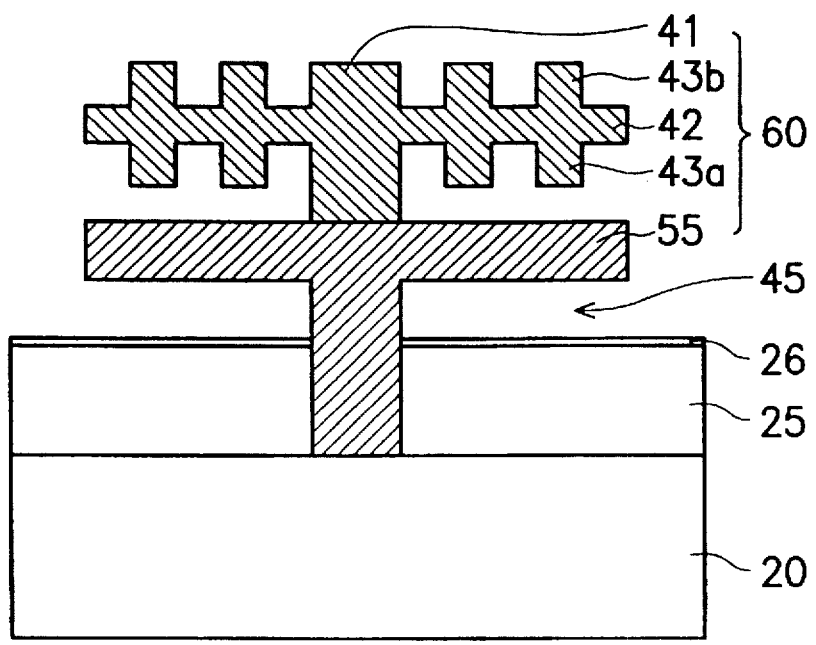

As illustrated in FIG. 10D, using a photoresist mask (not shown), the second conductive layer 30, the fourth insulating layer 27 and the first conductive layer 52 are etched by anisotropic etching, e.g., reactive ion etching to define a pattern area of a capacitor. After the photoresist is removed, using the second insulating layer 26 (silicon nitride layer) as an etching stop, the third insulating layer 51 (silicon oxide layer) is removed by isotropic etching. Up to this point in the process, the structure of the first and second conductive layers 52, 30 defines the storage electrode 60 of a capacitor, which includes a vertical frame 41, a first horizontal plate 55 and a second horizontal plate 42. The vertical frame 41 contacts the contact area of the substrate 20 through the first and second contact openings 28 and 50. The first and second horizontal plates 55, 42 are formed apart in sequence and extend parallel with the surface of the second insulating layer 26. The second horizontal plate 42 has a plurality of extending areas 43a and 43b which extend out vertically and are disposed symmetrically on the upper and lower surfaces of the horizontal plate 42, as shown.

Figure 10E:
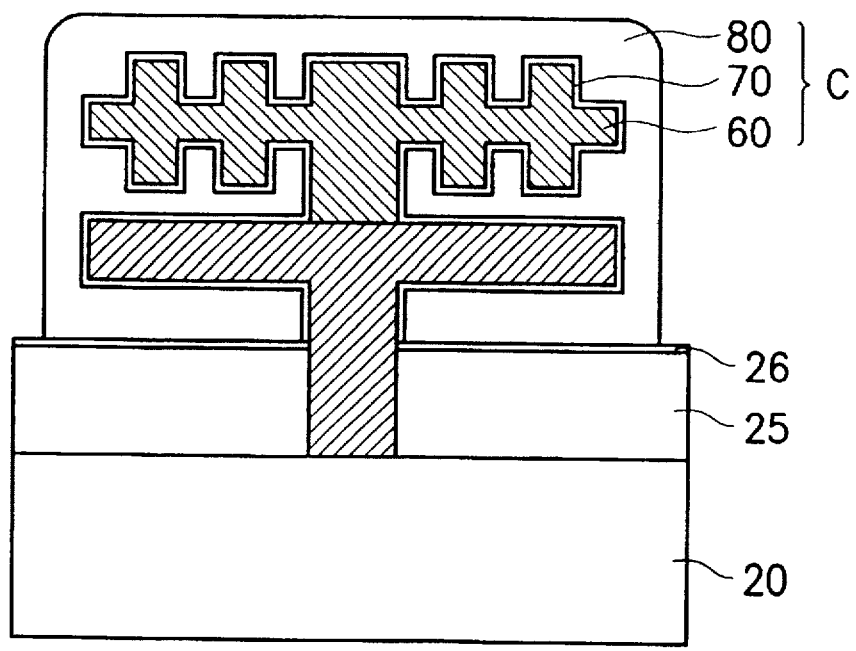

As illustrated in FIG. 10E, a dielectric layer 70 is formed over the exposed surface of the storage electrode 60. On the surface of the dielectric layer 70, an opposed electrode 80 is formed, thus completing the fabrication of the capacitor of a DRAM memory cell. The steps and the exemplary materials used in this part of the process are the same as in the above previously described exemplary embodiments, and therefore will not be described again.

Figure 10F:
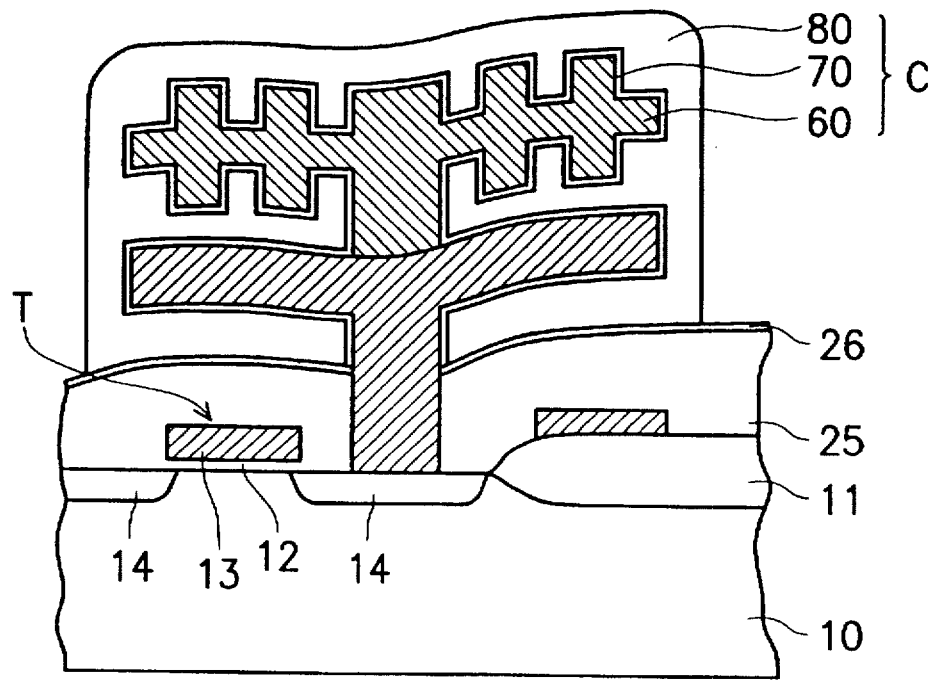

When considering the roughness caused by field oxide layer 11 and polysilicon gate layer 13, for example, the structure of the DRAM memory cell according to the present invention will be the structure as shown in FIG. 10F. It is clear that, in either FIGS. 10E or 10F, the surface area of the storage electrode 60 is significantly increased by virtue of the spacing (gap 45) between the first horizontal plate 55 and the second insulating layer 26 that efficiently increases the capacitance possible.

Embodiment 7

Figure 11A:
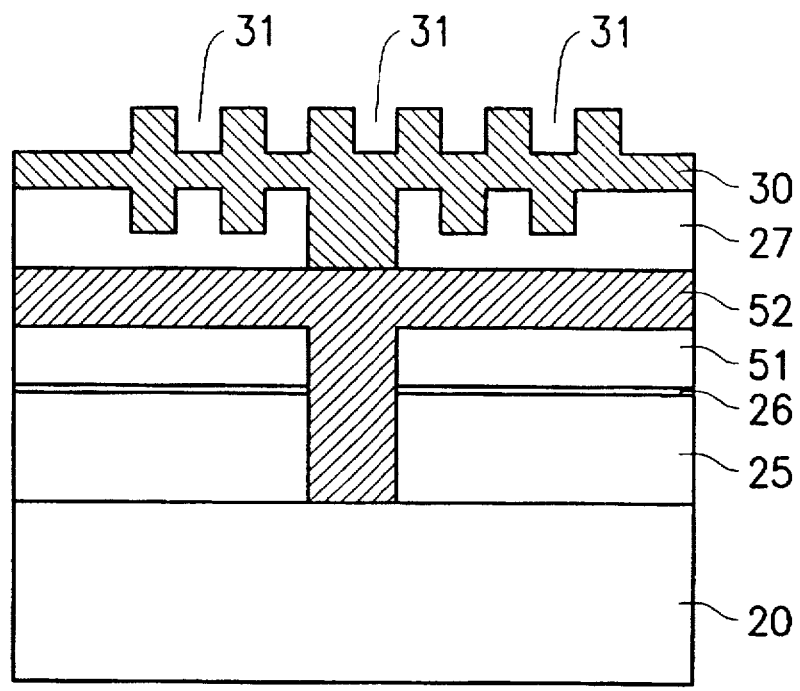
FIGS. 11A to 11D are cross-sectional diagrams illustrating the memory cell fabrication process of a seventh preferred embodiment according to the present invention.

This exemplary embodiment is based on the structure and process of exemplary embodiment 6 shown in FIGS. 10A to 10B and will be described using the same reference numerals. As shown in FIG. 11A, a second conductive layer 30 is formed over the fourth insulating layer 27 filling the second contact opening 28 and the plurality of the first trenches 29. For example, a polysilicon layer 30 is deposited to a thickness of about 7000Å by CVD and contacts the first conductive layer 52 through the second contact opening 28. Thereafter, using photolithography and etching, a plurality of second trenches 31 are formed on the upper portion of the second conductive layer 30 as illustrated.

Figure 11B:
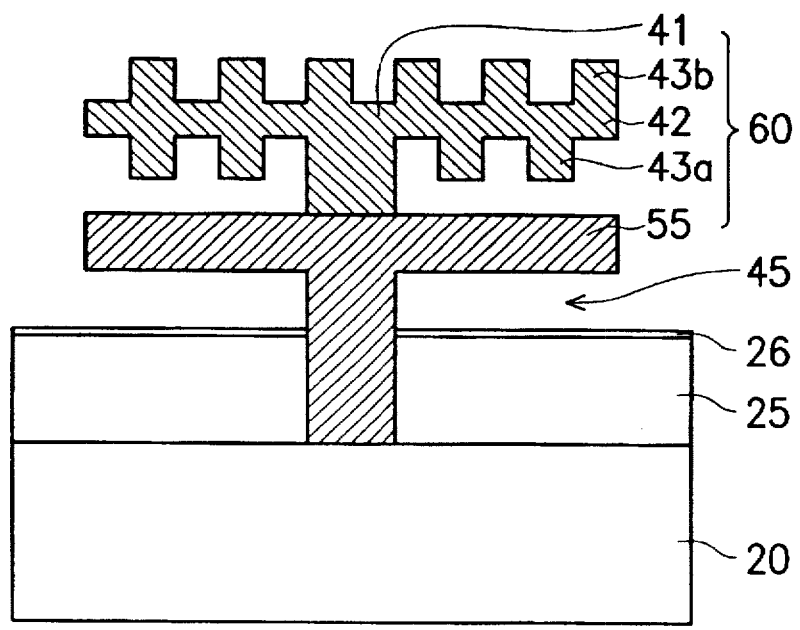

Next, performing the same process as shown in FIG. 10D, the second conductive layer 30, the fourth insulating layer 27, the first conductive layer 52 and the third insulating layer 51 are etched by anisotropic etching to define a pattern area of a capacitor. Then, the fourth and third insulating layers 27, 51 are removed by isotropic etching to obtain the structure as shown in FIG. 11B, forming the storage electrode 60 of a capacitor having the first and second conductive layers 52, 30. The storage electrode 60 includes a vertical frame 41, a first horizontal plate 55 and a second horizontal plate 42. The vertical frame 41 is coupled to the contact area of the substrate 20 through the first and second contact openings 50 and 28. The first and second horizontal plates 55, 42 are formed apart in sequence and extend parallel with the surface of the second insulating layer 26. A gap 45 is thus formed between the first horizontal plate 42 and the second insulating layer 26. The second horizontal plate 42 has a plurality of extending areas 43a and 43b which extend out vertically and are disposed asymmetrically on the upper and lower surfaces of the horizontal plate 42.

Figure 11C:
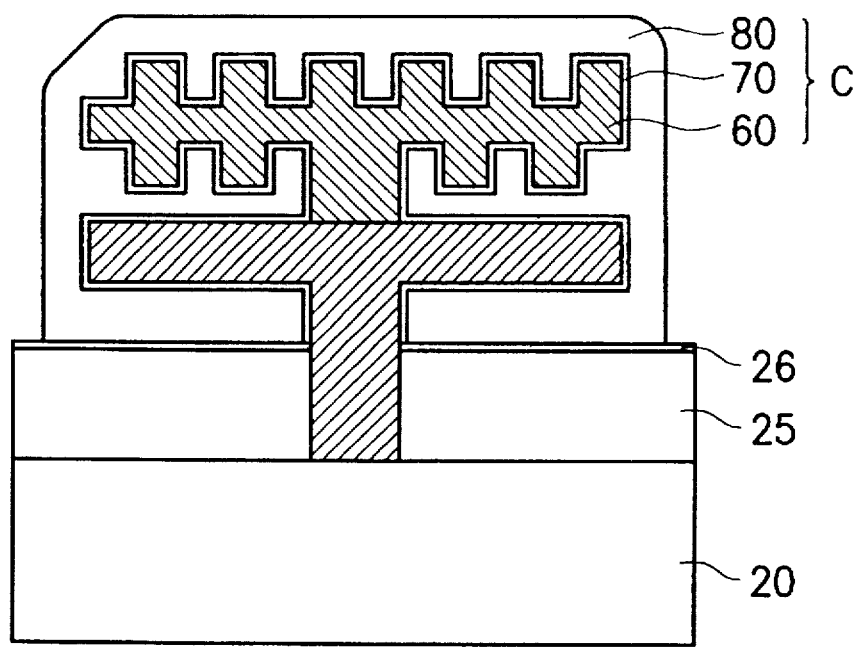

As shown in FIG. 11C, a dielectric layer 70 is formed over the exposed surface of the storage electrode 60. On the surface of the dielectric layer 70, an opposed electrode 80 is formed, thus completing the fabrication of the capacitor of a DRAM memory cell. The steps and the materials used in this process are the same as in the above previously mentioned and illustrated exemplary embodiments, and therefore will not be described again.

Figure 11D:
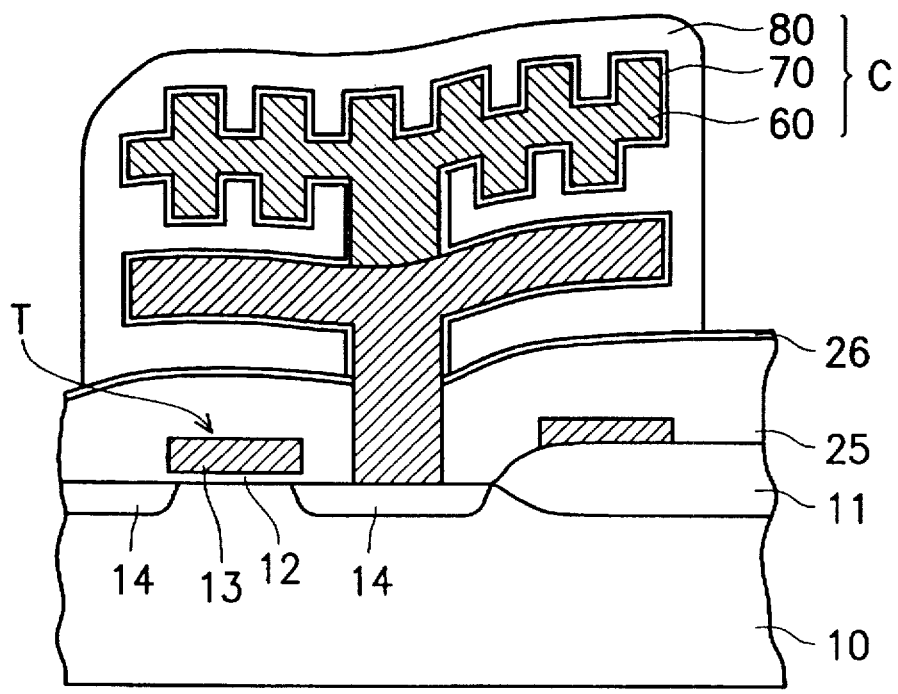

When considering the roughness caused by field oxide layer 11 and polysilicon gate layer 13, for example, the structure of the DRAM memory cell according to the present invention will be the structure as shown in FIG. 11D. It is clear that, in FIGS. 11C or 11D, the surface of the storage electrode 60 is significantly increased not only by the structure of the second horizontal plate 42 of the storage electrode 60, but also by virtue of the gap 45 separating the first horizontal plate 55 from the second insulating layer 26 that efficiently increases the capacitance possible.

For those skilled in the art, it should be apparent that the characteristics of the previously described preferred embodiments may be used individually or simultaneously, to build a variety of different kinds of storage electrodes. All sorts of variations in the structure of the storage electrodes are considered to be within the scope of the present invention as defined in the claims. It should be noted that although the drain electrodes of the exemplary transfer transistor illustrated are in a diffusion area of the silicon substrate, the present invention is not limited to this particular transistor structure. Other kinds of drain electrode structures could be used with the present invention, such as a trench type drain electrode structure, for example.

While the invention has been described by way of examples and in terms of preferred embodiments, it is to be understood that the invention is not limited to the disclosed exemplary embodiments. To the contrary, the scope of the invention is intended to include various modifications and similar arrangements within the spirit of the invention limited only by the appended claims, which should be accorded the broadest interpretation so as to encompass all such modifications and similar structures.

What is claimed is:

1. A method of fabricating a DRAM cell, comprising the steps of:

(a) forming a transfer transistor having a gate electrode and source-drain electrode areas on a semiconductor substrate;

(b) forming first, second and third insulating layers in sequence on the semiconductor substrate and the transfer transistor;

(c) forming a contact opening by seriatim etching through the third, second and first insulating layers exposing one of the source-drain electrode areas of the transfer transistor as a contact area;

(d) forming a plurality of first trenches by etching an upper portion of the third insulating layer (e) forming a first conductive layer extending over the third insulating layer and filling the contact opening and the plurality of first trenches;

(f) forming a plurality of second trenches by etching an upper portion of the first conductive layer, wherein the structure of the first conductive layer thereby includes a vertical frame contacting the contact area through the contact opening, and a horizontal plate having a plurality of extending areas which extend out vertically therefrom on upper and lower surfaces thereof;

(g) selectively etching the first conductive layer to define a pattern of a storage electrode of a capacitor;

(h) using the second insulating layer as an etching stop, removing the third insulating layer by isotropic etching;

(i) forming a dielectric layer on exposed surfaces of the storage electrode; and (j) forming a second conductive layer, which acts as an opposed electrode of the capacitor, on the dielectric layer.

2. The method of fabricating a DRAM cell according to claim 1, wherein the first insulating layer comprises a borophosphosilicate glass layer, the second insulating layer comprises a silicon nitride layer, and the third insulating layer comprises a silicon oxide layer.

3. The method of fabricating a DRAM cell according to claim 1, wherein the plurality of second trenches are formed in step (f) so that the plurality of extending areas which extend out vertically are disposed symmetrically on the upper and lower surfaces of the horizontal plate.

4. The method of fabricating a DRAM cell according to claim 1, wherein the plurality of second trenches are formed in step (f) so that the plurality of extending areas which extend out vertically are disposed asymmetrically on the upper and lower surfaces of the horizontal plate.

5. The method of fabricating a DRAM cell according to claim 1, wherein the first conductive layer and the second conductive layer comprise polysilicon layers.

6. A method of fabricating a DRAM cell, comprising the steps of:

(a) forming a transfer transistor having a gate electrode and source-drain electrode areas on a semiconductor substrate;

(b) seriatim forming first, second and third insulating layers on the semiconductor substrate and the transfer transistor;

(c) forming a contact opening by selectively etching through the third, second, and first insulating layers exposing one of the source-drain electrode areas as a contact area;

(d) forming a columnar conductive layer filling the contact opening;

(e) forming a plurality of first trenches by etching an upper portion of the third insulating layer;

(f) forming a first conductive layer extending over the third insulating layer filling the first trenches and contacting the columnar conductive layer;

(g) forming a plurality of second trenches by etching an upper portion of the first conductive layer, wherein both upper and lower surfaces of the first conductive layer thereby have a plurality of extending areas which extend out vertically therefrom;

(h) selectively etching the first conductive layer to a define a pattern of a storage electrode of a capacitor which includes the columnar conductive layer and the first conductive layer;

(i) using the second insulating layer as an etching stop, removing the third insulating layer by isotropic etching;

(j) forming a dielectric layer on exposed surfaces of the storage electrode; and (k) forming a second conductive layer, which acts as an opposed electrode of the capacitor, on the dielectric layer.

7. The method of fabricating a DRAM cell according to claim 6, wherein the first insulating layer comprises a borophosphosilicate glass layer, the second insulating layer comprises a silicon nitride layer, and the third insulating layer comprises a silicon oxide layer.

8. The method of fabricating a DRAM cell according to claim 6, wherein the plurality of second trenches are formed in step (g) so that the plurality of extending areas which extend out vertically are disposed symmetrically on the upper and lower surfaces of the first conductive layer.

9. The method of fabricating a DRAM cell according to claim 6, wherein the plurality of second trenches are formed by step (g) so that the plurality of extending areas which extend out vertically are disposed asymmetrically on the upper and lower surfaces of the first conductive layer.

10. The method of fabricating a DRAM cell according to claim 6, wherein the columnar conductive layer, the first conductive layer and the second conductive layer are polysilicon layers.

11. A method of fabricating a DRAM cell, comprising the steps of:

(a) forming a transfer transistor having a gate electrode and source-drain electrode areas on a semiconductor substrate;

(b) seriatim forming first and second insulating layers on the semiconductor substrate and the transfer transistor;

(c) forming a first contact opening by selectively etching through the second insulating layer and the first insulating layers exposing one of the source-drain electrode areas as a contact area;

(d) forming a first conductive layer extending over the second insulating layer, filling the first contact opening and contacting the contact area;

(e) forming a third insulating layer on the first conductive layer having a second contact opening disposed above the filled first contact opening exposing a portion of the surface of the first conductive layer;

(f) forming a plurality of first trenches by etching an upper portion of the third insulating layer;

(g) forming a second conductive layer extending over the third insulating layer, filling the second contact opening and the plurality of first trenches, and contacting the first conductive layer;

(h) forming a plurality of second trenches by etching an upper portion of the second conductive layer, wherein the structure of the second conductive layer thereby includes a vertical frame contacting the first conductive layer through the second contact opening, and a horizontal plate having a plurality of extending areas which extend out vertically therefrom on upper and lower surfaces thereof;

(i) using the second insulating layer as an etching stop, seriatim etching the second conductive layer, the third insulating layer and the first conductive layer to define a pattern of a storage electrode of a capacitor which includes the second and first conductive layers;

(j) removing the third insulating layer by isotropic etching;

(k) forming a dielectric layer on exposed surfaces of the storage electrode; and (l) forming a third conductive layer, which acts as an opposed electrode of the capacitor, on the dielectric layer.

12. The method of fabricating a DRAM cell according to claim 11, wherein the first insulating layer comprises a borophosphosilicate glass layer, the second insulating layer comprises a silicon nitride layer, and the third insulating layer comprises a silicon oxide layer.

13. The method of fabricating a DRAM cell according to claim 11, wherein the plurality of second trenches are formed in step (h) so that the plurality of extending areas which extend out vertically are disposed symmetrically on the upper and lower surfaces of the horizontal plate.

14. The method of fabricating a DRAM cell according to claim 11, wherein the plurality of second trenches are formed by step (h) so that the plurality of extending areas which extend out vertically are disposed asymmetrically on the upper and lower surfaces of the horizontal plate.

15. The method of fabricating a DRAM cell according to claim 11, wherein, the first and second conductive layers comprise polysilicon layers.

16. A method of fabricating a DRAM cell, comprising the steps of:

(a) forming a transfer transistor having a gate electrode and source-drain electrode areas on a semiconductor substrate;

(b) seriatim forming first, second and third insulating layers on the semiconductor substrate and the transfer transistor;

(c) forming a first contact opening by selectively etching through the third, the second and the first insulating layers exposing one of the source-drain electrode areas as a contact area;

(d) forming a first conductive layer extending over the third insulating layer and filling the first contact opening;

(e) forming a fourth insulating layer extending over the first conductive layer having a second contact opening disposed correspondingly above the first contact opening exposing a portion of the first conductive layer;

(f) etching an upper portion of the fourth insulating layer forming a plurality of first trenches;

(g) forming a second conductive layer extending over the fourth insulating layer, filling the second contact opening and the plurality of first trenches, and contacting the first conductive layer;

(h) forming a plurality of second trenches by etching an upper portion of the second conductive layer, wherein the structure of the second conductive layer thereby includes a vertical frame contacting the first conductive layer through the second contact opening, and a horizontal plate having a plurality of extending areas which extend out vertically therefrom on upper and lower surfaces thereof;

(i) using the second insulating layer as an etching stop, seriatim etching the second conductive layer, the fourth insulating layer, the first conductive layer and the third insulating layer to define a pattern of a storage electrode of a capacitor which includes the second and first conductive layers;

(j) removing the fourth and third insulating layers by isotropic etching;

(k) forming a dielectric layer on exposed surfaces of the storage electrode; and (l) forming a third conductive layer, which acts as an opposed electrode of the capacitor, on the dielectric layer.

17. The method of fabricating a DRAM cell according to claim 16, wherein the first insulating layer comprises a borophosphosilicate glass layer, the second insulating layer comprises a silicon nitride layer, and the third insulating layer comprises a silicon oxide layer.

18. The method of fabricating a DRAM cell according to claim 16, wherein the plurality of second trenches are formed in step (h) so that the plurality of extending areas which extend out vertically are disposed symmetrically on the upper and lower surfaces of the horizontal plate.

19. The method of fabricating a DRAM cell according to claim 16, wherein the plurality of second trenches are formed by step (h) so that the plurality of extending areas which extend out vertically are disposed asymmetrically on the upper and lower surfaces of the horizontal plate.

20. The method of fabricating a DRAM cell according to claim 16, wherein the first, second and third conductive layers comprise polysilicon layers.

* * * * *